US012476077B2

(12) United States Patent
Long et al.

(10) Patent No.: US 12,476,077 B2
(45) Date of Patent: Nov. 18, 2025

(54) INDUCTION COIL ASSEMBLY FOR PLASMA PROCESSING APPARATUS

(71) Applicants: Mattson Technology, Inc., Fremont, CA (US); Beijing E-Town Semiconductor Technology Co., Ltd., Beijing (CN)

(72) Inventors: Maolin Long, Santa Clara, CA (US); Yu Guan, San Jose, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 338 days.

(21) Appl. No.: 17/550,158

(22) Filed: Dec. 14, 2021

(65) Prior Publication Data

US 2022/0208512 A1 Jun. 30, 2022

Related U.S. Application Data

(60) Provisional application No. 63/147,817, filed on Feb. 10, 2021, provisional application No. 63/131,026, filed on Dec. 28, 2020.

(51) Int. Cl.
*H01J 37/32* (2006.01)
*H01L 21/67* (2006.01)

(52) U.S. Cl.
CPC ......... *H01J 37/3211* (2013.01); *H01J 37/321* (2013.01); *H01J 37/32577* (2013.01); *H01J 37/32119* (2013.01); *H01L 21/67069* (2013.01)

(58) Field of Classification Search
CPC ................. H01J 37/321; H01J 37/3211; H01J 37/32119; H01J 37/32174;
(Continued)

(56) References Cited

U.S. PATENT DOCUMENTS 6,237,526 B1 * 5/2001 Brcka ................. H01J 37/3222 315/111.21
6,291,793 B1 9/2001 Qian et al.
(Continued)

FOREIGN PATENT DOCUMENTS

| | | |
|---|---|---|
| CN | 1812010 | 8/2006 |
| CN | 1851844 | 10/2006 |
| CN | 111785605 | 10/2020 |

OTHER PUBLICATIONS

The International Search Report and Written Opinion Corresponding to Application No. PCT/US2021/062558 on Dec. 9, 2021. (10 pages).

*Primary Examiner* — Kurt Sweely
(74) *Attorney, Agent, or Firm* — Dority & Manning, P.A.

(57) ABSTRACT

An induction coil assembly is disclosed including two induction coils. Each induction coil includes a first winding commencing from a first terminal end in a first position in the z-direction and transitioning to a radially inner position in a plane normal to the z-direction and a second winding commencing from the radially inner position and transitioning to a radially outer position in a second plane normal to the z-direction and terminating in a second terminal end. Plasma processing apparatuses incorporating the induction coil assembly are also provided.

13 Claims, 9 Drawing Sheets

(58) Field of Classification Search

CPC ............. H01J 37/32183; H01J 37/3244; H01J 37/32541; H01J 37/32568; H01J 37/32577; H01J 37/32651; H01J 37/32715; H01L 21/67069; C23C 16/45506; C23C 16/45508; C23C 16/4551; C23C 16/45563; C23C 16/45565; C23C 16/4583; C23C 16/505; C23C 16/507; C23C 16/509; C23C 16/5093; C23C 16/5096

See application file for complete search history.

(56) References Cited

U.S. PATENT DOCUMENTS

| | | | | |
|---|---|---|---|---|
| 6,494,998 | B1 | 12/2002 | Brcka | |
| 6,694,915 | B1 * | 2/2004 | Holland | H01J 37/321 118/723 R |
| 6,893,533 | B2 | 5/2005 | Holland et al. | |
| 7,571,697 | B2 | 8/2009 | Benjamin et al. | |
| 8,299,391 | B2 | 10/2012 | Todorow et al. | |
| 9,384,948 | B2 | 7/2016 | Long et al. | |
| 9,653,264 | B2 * | 5/2017 | Nagorny | H01J 37/321 |
| 10,325,758 | B2 | 6/2019 | Yamawaku et al. | |
| 10,332,725 | B2 | 6/2019 | Sato et al. | |
| 2008/0185284 | A1 | 8/2008 | Chen et al. | |
| 2011/0108194 | A1 * | 5/2011 | Yoshioka | H01J 37/3211 156/345.35 |
| 2013/0278136 | A1 * | 10/2013 | Lee | H05H 1/46 313/307 |
| 2014/0190635 | A1 | 7/2014 | Lee et al. | |
| 2015/0235810 | A1 * | 8/2015 | Long | H01J 37/32651 315/111.21 |
| 2017/0186585 | A1 * | 6/2017 | Zuo | H01J 37/3211 |
| 2017/0200585 | A1 * | 7/2017 | Wang | H01F 27/28 |
| 2018/0233326 | A1 * | 8/2018 | Tan | H01J 37/3211 |
| 2020/0051826 | A1 * | 2/2020 | Glukhoy | H01L 21/30655 |
| 2020/0118792 | A1 | 4/2020 | Mopidevi et al. | |
| 2020/0219698 | A1 | 7/2020 | Ye et al. | |

* cited by examiner

INDUCTION COIL ASSEMBLY FOR PLASMA PROCESSING APPARATUS

PRIORITY CLAIM

The present application claims the benefit of priority of U.S. Provisional Application Ser. No. 63/131,026, titled "Induction Coil Assembly for Plasma Processing Apparatus," filed on Dec. 28, 2020, which is incorporated herein by reference. The present application claims the benefit of priority of U.S. Provisional Application Ser. No. 63/147,817, titled "Induction Coil Assembly for Plasma Processing Apparatus," filed on Feb. 10, 2021, which is incorporated herein by reference.

FIELD

The present disclosure relates generally to a plasma processing apparatus for plasma processing of a workpiece. More specifically, the present disclosure is directed to an induction coil assembly for the plasma processing apparatus.

BACKGROUND

RF plasmas are used in the manufacture of devices such as integrated circuits, micromechanical devices, flat panel displays, and other devices. RF plasma sources used in modern plasma etch applications are required to provide a high plasma uniformity and a plurality of plasma controls, including independent plasma profile, plasma density, and ion energy controls. RF plasma sources typically must be able to sustain a stable plasma in a variety of process gases and under a variety of different conditions (e.g. gas flow, gas pressure, etc.). In addition, it is desirable that RF plasma sources produce a minimum impact on the environment by operating with reduced energy demands and reduced EM emission.

Problems associated with inductively coupled plasma (ICP) sources is a severe sputtering of a dielectric plate separating an ICP coil from a process chamber due to RF power capacitive coupling from the coil to plasma and very high voltage (a few kV per turn) applied to the coil. The sputtering both affects plasma and increases the capital cost of the tool and its maintenance cost. Overall process controllability and, finally, process yield deteriorates. Yet another common problem with ICP systems is an azimuthal nonuniformity caused by the capacitive coupling of the coil. Accordingly, improved plasma processing apparatuses and systems are needed.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
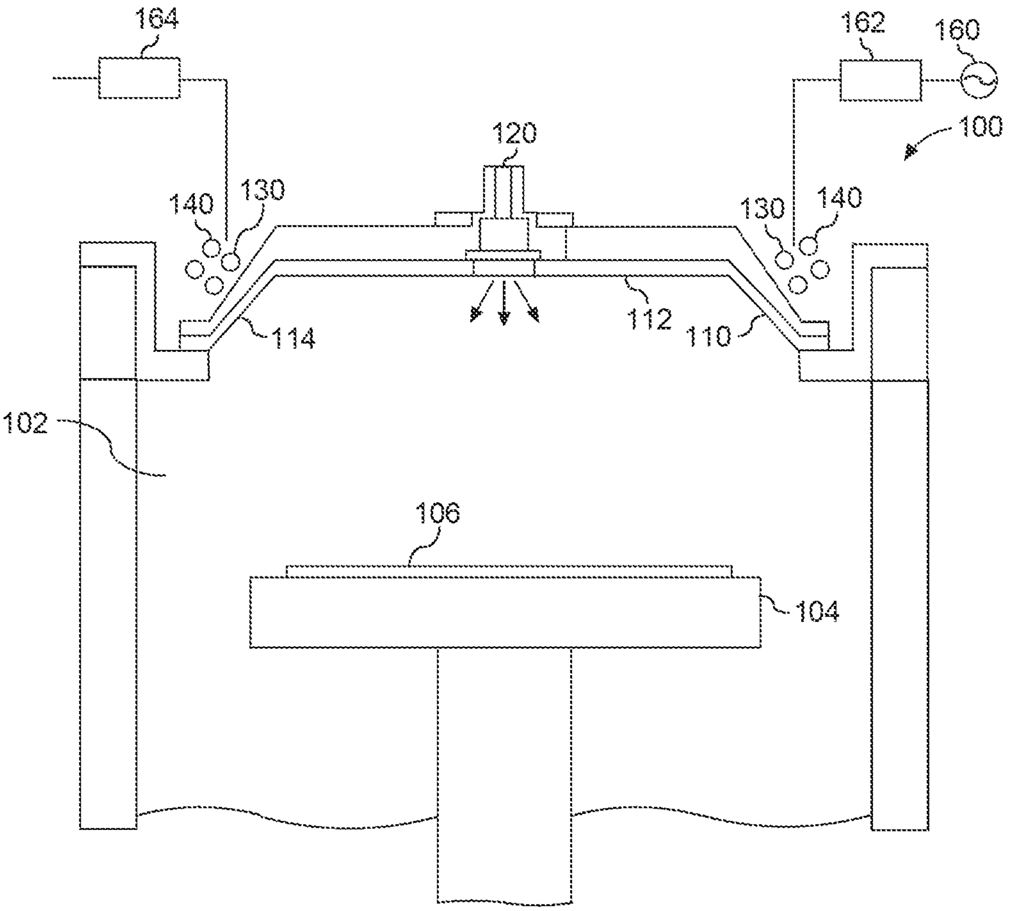
FIG. 1 depicts an example plasma processing apparatus according to example embodiments of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

As used herein, use of the term "about" in conjunction with a stated numerical value can include a range of values within 10% of the stated numerical value.

Conventional plasma processing apparatuses include an induction coil. When the induction coil is energized with RF power from a RF generator, a substantially inductive plasma is induced in a plasma chamber. Furthermore, the induction coil can be capacitively coupled to the plasma. This capacitive coupling of the induction coil to the plasma can affect treatment processes (e.g., etching, sputtering) performed on a workpiece disposed within the plasma chamber. For instance, capacitive coupling can cause non-uniformities in the treatment process to occur. Further, a single induction coil cannot be symmetrical and uniform due, at least in part, to an uneven voltage drop across a length of the induction coil as well as singularities of an electric field generated near terminals of the single induction coil. Accordingly, improved induction coil assemblies and processing apparatuses are needed that can reduce and/or eliminate non-uniformities caused by capacitive coupling.

In general, aspects of the present disclosure are directed to an induction coil assembly and a plasma processing apparatus that include two or more inductive elements, such as a first induction coil and a second induction coil. As will be discussed further below, each of the induction coils can be spatially configured to reduce capacitive coupling between the inductive plasma and each of the induction coils. For example, the first induction coil and the second induction coil can be interleaved, bi-level coils. The first induction coil and second induction coil can be coupled to a RF power source and can also be grounded via a capacitor. In particular embodiments, both the first and second induction coil can be coupled to the same RF power source. Each induction coil includes a first winding generally located in a plane normal to the z-direction and a second winding located in a different plane normal to the z-direction. For the plasma apparatus, a Faraday shield (e.g., a grounded Faraday shield) can be disposed between the processing chamber and the induction coil assembly.

The coil assembly according to example embodiments of the present disclosure can provide numerous benefits and technical effects. For instance, the induction coils (e.g., the first induction coil and second induction coil) can be symmetrical and balanced. In this manner, capacitive coupling between the inductive plasma and each of the induction coils can be reduced. Furthermore, since capacitive coupling between the inductive plasma and each of the induction coils can be reduced, non-uniformities associated with a treatment process (e.g., etching, sputtering) performed on a workpiece (e.g. wafer) positioned within a processing chamber of a plasma processing apparatus can be reduce. Furthermore, the induction coils of the coil assembly can be configured to accommodate plasma chambers having different design constraints. In this manner, the coil assembly can be configured to accommodate variations in the processing chamber across different plasma processing apparatuses.

FIG. 1 depicts a plasma processing apparatus 100 according to an example embodiment of the present disclosure. The plasma processing apparatus 100 includes a processing chamber defining an interior space 102. A workpiece support 104 (e.g., pedestal) is used to support a workpiece 106, such as a semiconductor wafer, within the interior space 102. A dielectric window 110 is located above the substrate holder 104. The dielectric window 110 includes a relatively flat central portion 112 and an angled peripheral portion 114. The dielectric window 110 includes a space in the central portion 112 for a showerhead 120 to feed process gas into the interior space 102.

The apparatus 100 further includes and induction coil assembly including one or more inductive elements for generating an inductive plasma in the interior space 102 of the processing chamber. The inductive elements can include a first induction coil 130 and a second induction coil 140 that when supplied with RF power, induce a plasma in the process gas in the interior space 102 of plasma processing apparatus 100. For instance, a RF generator 160 can be configured to provide electromagnetic energy through a matching network 162 to the both the first induction coil 130 and the second induction coil 140. Further, the first induction coil 130 and the second induction coil can be coupled to ground via a capacitor 164. Alternatively, or additionally, each of the first induction coil 130 and the second induction coil 140 can be positioned at a location needed to minimize any asymmetries. For instance, the first induction coil 130 and second induction coil 140 can be positioned such that the terminal ends from each coil are positioned to reduced asymmetries, as will be discussed further hereinbelow.

According to aspects of the present disclosure, the apparatus 100 can include a Faraday shield 154 disposed between the first induction coil 130, the second induction coil 140, and the processing chamber. For example, in certain embodiments the apparatus 100 includes a Faraday shield 154 disposed between the first induction coil 130, the second induction coil 140, and the dielectric window 110. Faraday shield 154 can be a slotted metal shield that reduces capacitive coupling between the first induction coil 130 and/or second induction coil 140 and the interior space 102 of the process chamber. As illustrated, Faraday shield 154 can fit over the angled portion of the dielectric window 110. Portions of the multi-turn coil of the first induction coil 130 and/or the second induction coil 140 can be located adjacent the Faraday shield 154. The Faraday shield 154 can be grounded.

Figure 2:
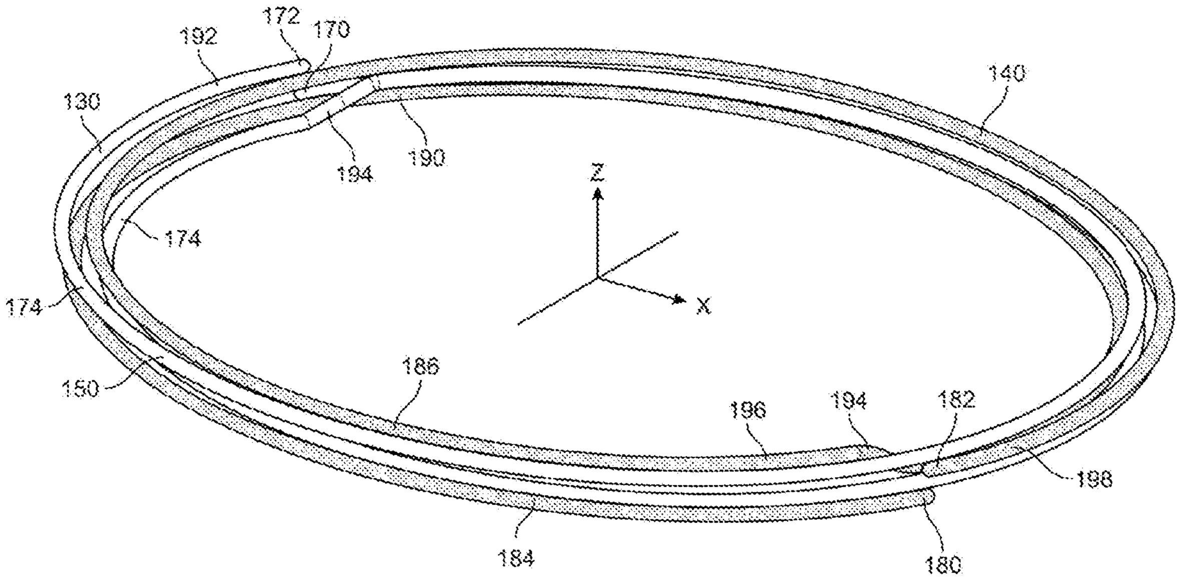
FIG. 2 depicts an example induction coil assembly for a plasma processing apparatus according to example embodiments of the present disclosure.
Figure 3:
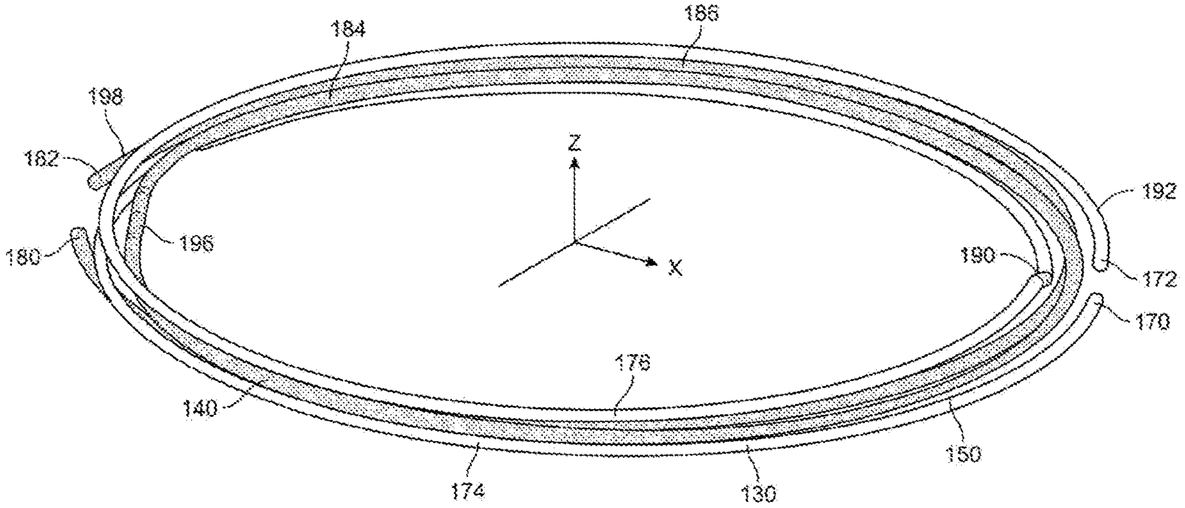
FIG. 3 depicts an example induction coil assembly for a plasma processing apparatus according to example embodiments of the present disclosure.
Figure 4:
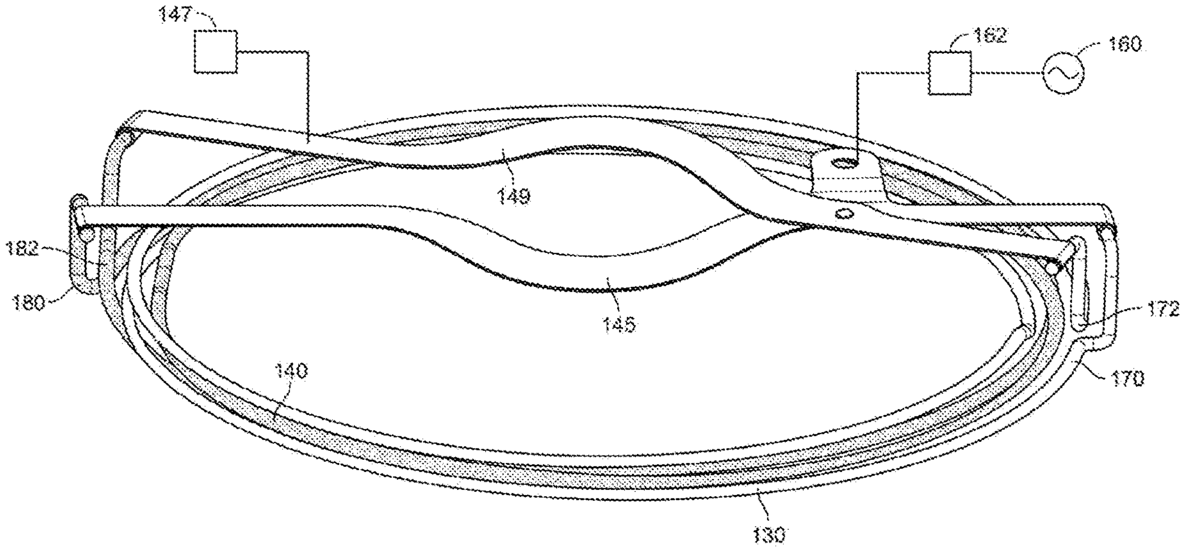
FIG. 4 depicts an example induction coil assembly for a plasma processing apparatus according to example embodiments of the present disclosure.
Figure 5:
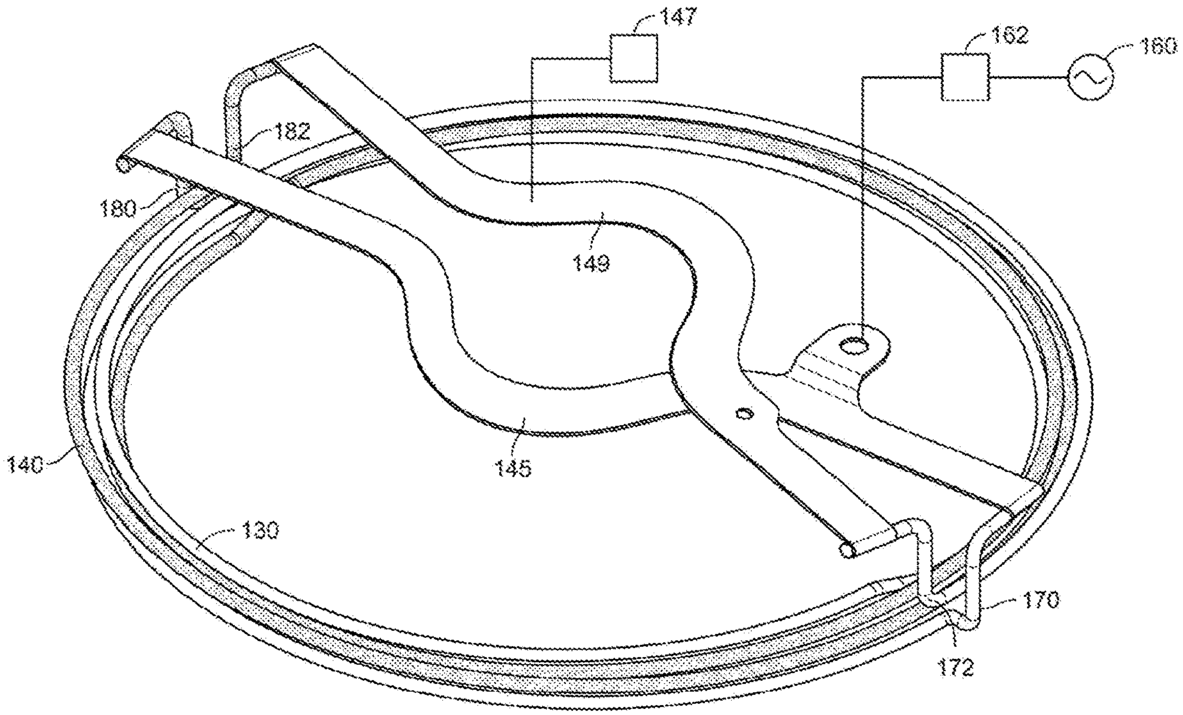
FIG. 5 depicts an example induction coil assembly for a plasma processing apparatus according to example embodiments of the present disclosure.
Figure 6:
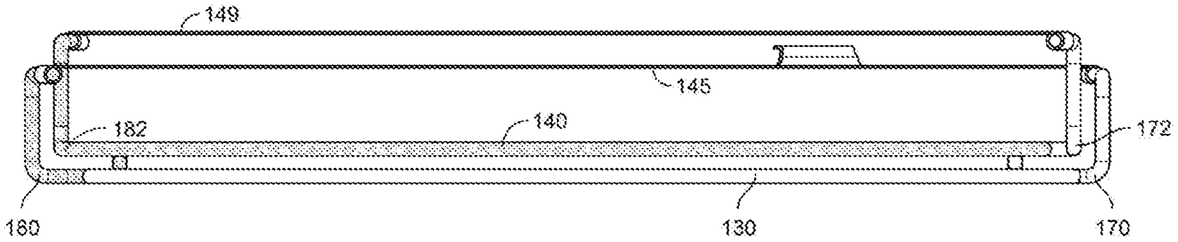
FIG. 6 depicts a cross-sectional view of an example induction coil assembly for a plasma processing apparatus according to example embodiments of the present disclosure.
Figure 7:
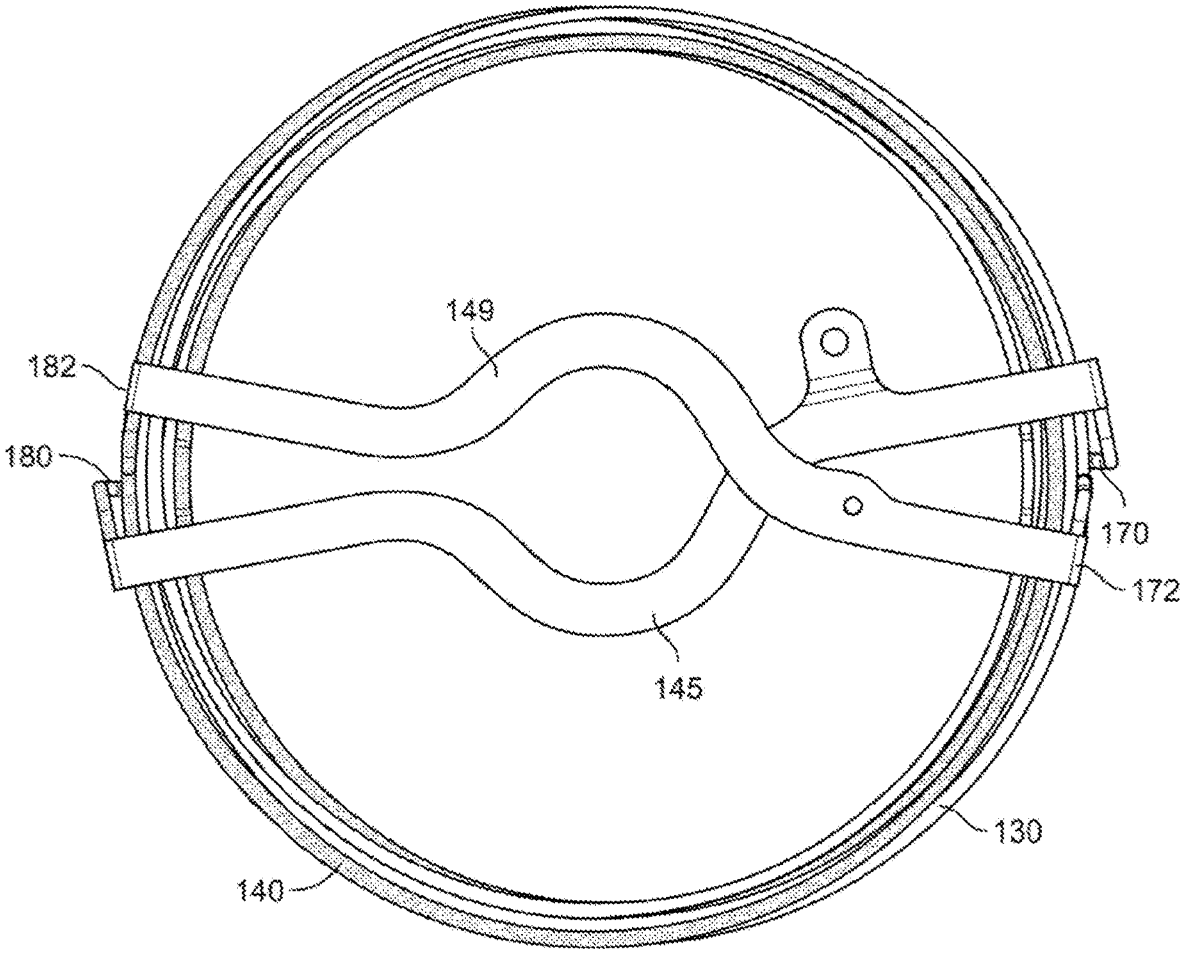
FIG. 7 depicts a top-down view of an example induction coil assembly for a plasma processing apparatus according to example embodiments of the present disclosure.
Figure 8:
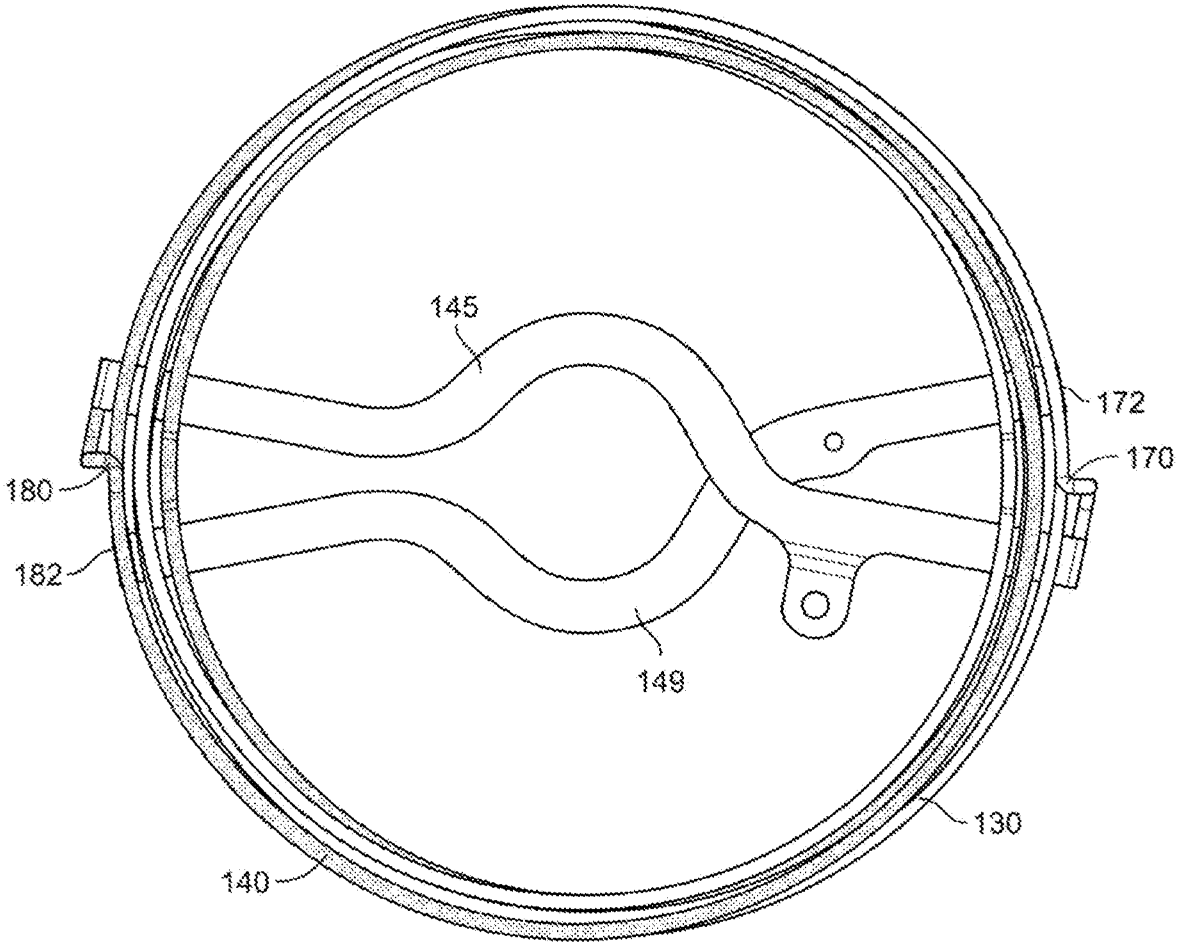
FIG. 8 depicts bottom-up view of an example induction coil assembly for a plasma processing apparatus according to example embodiments of the present disclosure.

Example aspects of the induction coil assembly will be discussed further with reference to FIGS. 2-8. For example, as shown in FIGS. 2-3, the first induction coil 130 has a first terminal end 170 and a second terminal end 172. The first induction coil 130 includes a first winding 174 commencing from the first terminal end 170 and completing a 360° turn. As the first induction coil 130 is wound to form the first winding 174, the first induction coil 130 transitions to an inner position 190 in a plane normal to the z-direction. Stated differently, as the first winding 174 is completed, the first induction coil 130 is located at a radially inner position with respect to the position of the first terminal end 170. The first induction coil 130 then completes a second winding 176. The second winding 176 commences from the inner position 190 and transitions to a radially outer position 192 in a second plane normal to the z-direction. For example, as the first induction coil 130 is wound to form the second winding 176, the first induction coil 130 transitions radially out from the inner position 190. The second winding 176 of the first induction coil 130 terminates in the second terminal end 172. In such embodiments, the first terminal end 170 is disposed below the second terminal end 172 in the z-direction. In other embodiments, the first terminal end 170 and the second terminal end 172 may be disposed in the same plane normal to the z-direction. (Not shown).

Further, the first induction coil 130 can be configured as a bi-level coil having the first winding 174 on a first plane normal to the z-direction and the second winding 176 on a second plane that is above the first plane and is normal to the z-direction. For example, upon completion of the first winding 174, the first induction coil 130 commences the second winding 176 at a location that is above the location of the first terminal end 170 in the z-direction. In other words, the second winding 176 is commenced and/or completed in a plane normal to the z-direction that is above the location of the first terminal end 170 of the first induction coil 130. In such embodiments, the first induction coil 130 resembles a helix that is being stretched in the z-direction. In some embodiments, the first winding 174 and the second winding 176 can be connected via a component 194 that is not integral with the first induction coil 130. Stated another way, the first induction coil 130 can define a gap that can accommodate the component 194 needed to electrically couple the first winding 174 to the second winding 176. Use of the component 194, can reduce the amount of space occupied by the first induction coil 130.

In certain embodiments, the first terminal end 170 and the second terminal end 172 can be aligned along an azimuth direction. In other embodiments, the first terminal end 170 and the second terminal end 172 can be offset relative to one another by any suitable amount. For instance, in implementations the first terminal end 170 and the second terminal end 172 can be offset so that the first induction coil defines a gap. In embodiments, the first terminal end 170 and the second terminal end 172 can be offset by at least 30 degrees.

Similarly, the second induction coil 140 has a first terminal end 180 and a second terminal end 182. The second induction coil 140 includes a first winding 184 commencing from the first terminal end 180 and completing a 360° turn. As the second induction coil 140 is wound to form the first winding 184, the second induction coil 140 transitions to an inner position 196 in a plane normal to the z-direction. Stated differently, as the first winding 184 is completed, the second induction coil 140 is located at a radially inner position with respect to the position of the first terminal end 180. The second induction coil 140 then completes a second winding 186. The second winding 186 commences from the inner position 196 and transitions to a radially outer position 198 in a second plane normal to the z-direction. For example, as the second induction coil 140 is wound to form the second winding 186, the second induction coil 140 transitions radially out from the inner position 196. The second winding 186 of the second induction coil 140 terminates in the second terminal end 182. In such embodiments, the first terminal end 180 is disposed below the second terminal end 182 in the z-direction. In other embodiments, the first terminal end 180 and the second terminal end 182 may be disposed in the same plane normal to the z-direction. (Not shown).

Further, the second induction coil 140 can be configured as a bi-level coil having the first winding 184 on a first plane normal to the z-direction and the second winding 186 on a second plane that is above the first plane and is normal to the z-direction. For example, upon completion of the first winding 184, the second induction coil 140 commences the second winding 186 at a location that is above the location of the first terminal end 180 in the z-direction. In other words, the second winding 186 is commenced and/or completed in a plane normal to the z-direction that is above the location of the first terminal end 180. In such embodiments, the second induction coil 140 resembles a helix that is being stretched in the z-direction. In some embodiments, the first winding 184 and the second winding 186 can be connected via a component 194 that is not integral with the second induction coil 140. Stated another way, the second induction coil 140 can define a gap that can accommodate the component 194 needed to electrically couple the first winding 184 to the second winding 186. Use of the component 194, can reduce the amount of space occupied by the second induction coil 130.

In certain embodiments, the first terminal end 180 and the second terminal end 182 can be aligned along an azimuth direction. In other embodiments, the first terminal end 180 and the second terminal end 182 can be offset relative to one another by any suitable amount. For instance, in implementations the first terminal end 180 and the second terminal end 182 can be offset so that the first induction coil defines a gap. In embodiments, the first terminal end 180 and the second terminal end 182 can be offset by at least 30 degrees.

Additionally, in certain embodiments terminal ends 170, 172,180,182 are all located in a same plane normal to the z-direction (not shown). In this manner, each of the induction coils 130,140 can be symmetrical with all terminal ends 170,172,180,182 on the same level and without any gaps along the length of their windings (or having incomplete turns). Such embodiments can be desirable in implementation in which the induction coils are configured in a parallel configuration. In embodiments, the first and second terminal ends 170,172 of the first induction coil 130 and the first and second terminal ends 180,182 of the second induction coil 140 are spaced at different azimuthal locations.

While example embodiments illustrated herein include two windings, the disclosure is not so limited. Indeed, additional windings such as a third winding, fourth winding, etc. can be incorporated to the induction coils described herein. Additional turns or windings can be incorporated depending on desired processing implementations.

As shown, the first induction coil 130 and the second induction coil 140 are in a stacked arrangement. In such embodiments, the overall configuration of the windings of the first induction coil 130 and the second induction coil 140 may be the same or similar, except that the terminal ends 170,172 of the first induction coil 130 and the terminal ends 180,182 of the second induction coil 140 are spaced generally opposite from each other in the x-direction. The x-direction can be generally perpendicular to the z-direction (e.g., within 5 degrees of perpendicular). For example, the terminal ends 170,172 may be spaced within about 30° from 180° from the terminal ends 180, 182. The first induction coil 130 and the second induction coil 140 can be stacked or spaced with respect to each other such that a gap 150 is defined between at least one or more portions of the first induction coil 130 and the second induction coil 140. The gap 150 can be defined between the first induction coil 130 and the second induction coil 140, such that the gap is uniform along the first and second windings 174,176,184, 186 of the first and second induction coils 130140. The gap 150 can have a distance in the z-direction of from about 1 mm to about 50 mm, such as from about 5 mm to about 45 mm, such as from about 10 mm to about 40 mm, such as from about 15 mm to about 35 mm, such as from about 20 mm to about 30 mm. In such a stacked configuration, the first induction coil 130 and the second induction coil 140 each have a uniform height in the z-direction. Further, in embodiments, each of the first windings 174,184 each have a uniform radius decrease and the second windings 176,186 each have a uniform radius increase.

Referring now to FIGS. 4-8. The first terminal ends 170,180 are configured such that they can be coupled to a RF power source, such as an RF generator 160 and an auto-tuning matching network and can be operated at an increased RF frequency, such as at about 13.56 MHz. For example, the first terminal ends 170, 180 can each be coupled to a conductive strap 145 that is then coupled to an RF power source. The RF power source typically feeds RF power through an impedance matching device 146 to the center of the conductive strap 145 coupled to the first terminal ends 170,180. The second terminal ends 172,182 can be configured to be coupled to ground via a capacitor 147. For instance, the second terminal ends 172,182 can be coupled to a conductive strap 149 that is grounded at its center through a capacitor 147 (e.g., a terminating capacitor). In other embodiments, the capacitor 147 can be coupled to the center of the conductive strap 149. In other embodiments, the capacitor 147 can be coupled to the center of the Faraday shield 154 (not shown). In some implementations, a value of the capacitor 147 can be chosen such that an impedance between an electrical ground and an RF power source providing the RF feed to each of the induction coils 130,140 is about one-half of an impedance of the induction coils 130,140 at an operating frequency (e.g., about 13 MHz). In this manner, each of the induction coils 130,140 is balanced (that is, each of the induction coils 130,140 always has a potential of about 0 Volts at a halfway point of its length). In this manner, capacitive coupling of each of the induction coils 130,140 can be reduced or eliminated. In such an embodiment, both the first and second induction coils 130,140 are balanced, for example each has a near zero voltage at the halfway point of its length, which results in minimal capacitive coupling and non-uniformity. Furthermore, since capacitive coupling of each of the induction coils 130,140 to the inductive plasma can be reduced, non-uniformities associated with the treatment process (e.g., etching, sputtering) performed on the workpiece (e.g., wafer) can be reduced.

In embodiments, the positioning of the first induction coil 130, second induction coil 140, conductive straps 145, 149, RF power source feed point, and/or capacitor connection points can all be chosen in order to minimize any asymmetry so that capacitive coupling and non-uniformity can be cancelled out to a maximum extent possible. Furthermore, it should be appreciated that one or more properties (e.g., position of terminals, number of turns, winding patterns, etc.) associated with each of the induction coils can be adjusted to reduce or minimize capacitive coupling between the inductive plasma and each of the induction coils.

Figure 9:
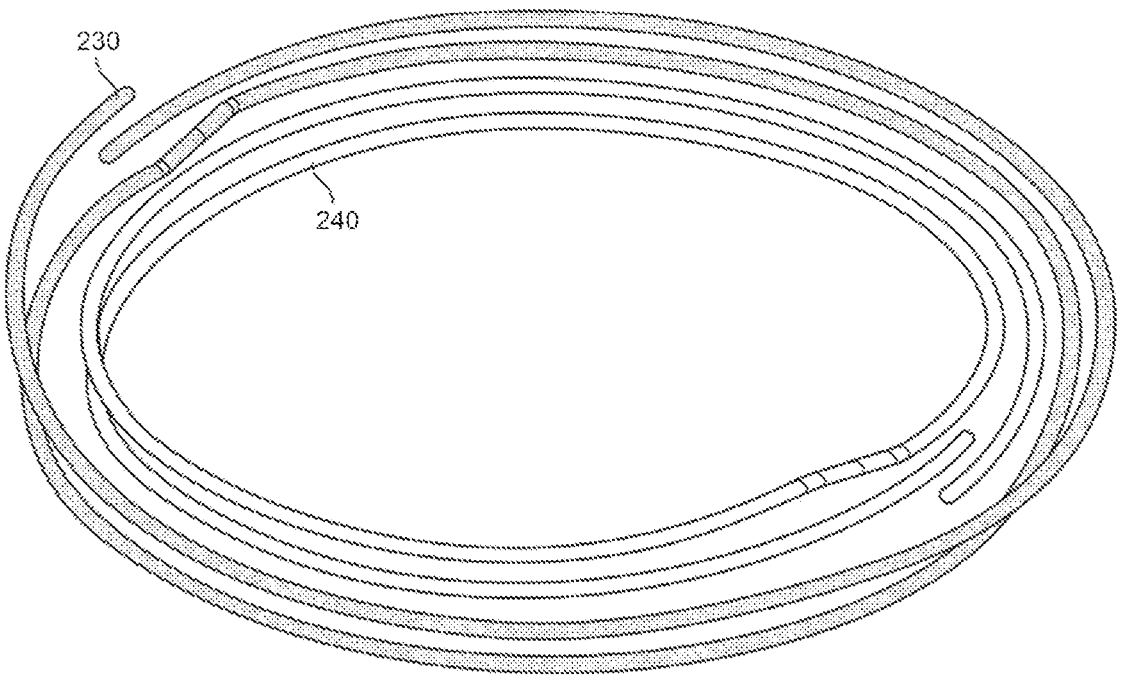
FIG. 9 depicts concentric bi-level induction coils of an induction coil assembly for a plasma processing apparatus according to example embodiments of the present disclosure.

FIG. 9 illustrates an induction coil assembly having a first induction coil 230 and a second induction coil 240 disposed concentrically with respect to each other. For example, the first induction coil 230 is disposed radially inward from the second induction coil 240. In such embodiments, the first induction coil 230 and second induction coil 240 are not interleaved. The first induction coil 230 and the second induction coil 240 are bi-level coils each having a first winding and a second winding located in different positions with respect to the z-direction. For example, the first induction coil includes a first winding commencing from a first terminal end and a second winding terminating in a second terminal end. The first winding is disposed in a first location in the z-direction and the second winding is disposed in a second location above the first location in the z-direction. Similarly, the second induction coil includes a second winding extending from a first terminal end and a second winding terminating in a second terminal end, the first winding disposed in a first location in the z-direction the second winding disposed in a second location above the first location in the z-direction.

In certain embodiments, the induction coil assembly includes a first induction coil having at least two or more windings. The at least two windings are wound in a spiral helix shape in a three-dimensional geometry having a uniform height increase or decrease in the z-direction and a uniform radius decrease. The induction coil assembly also includes a second induction coil having at least two or more windings. The at least two windings are wound in a spiral helix shape in a three-dimensional geometry having a uniform height increase or decrease in the z-direction and a uniform radius decrease. In such embodiments, the at least two or more windings of the first induction coil and the at least two or more windings of the second induction coil are in a stacked arrangement, the spacing between first induction coil and the second induction coil is uniform along the length of the windings.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An induction coil assembly comprising:

a first induction coil having a first winding and a second winding, the first winding commencing from a first terminal end in a first position in a z-direction and transitioning to a radially inner position in a plane normal to the z-direction, the second winding commencing from the radially inner position and transitioning to a radially outer position in a second plane normal to the z-direction and terminating in a second terminal end; and a second induction coil having a first winding and a second winding, the first winding commencing from a first terminal end in a first position in the z-direction and transitioning to a radially inner position in a plane normal to the z-direction, the second winding commencing from the radially inner position and transitioning to a radially outer position in a second plane normal to the z-direction and terminating in a second terminal end;

wherein the first induction coil and second induction coil are disposed in a stacked arrangement.

2. The induction coil assembly of claim 1, wherein a gap is defined between the first induction coil and the second induction coil, the gap being uniform along the first and second windings of the first induction coil and the second induction coil.

3. The induction coil assembly of claim 2, wherein the gap is about 1 mm to about 50 mm.

4. The induction coil assembly of claim 1, wherein the first induction coil and second induction coil each have a uniform height in the z-direction.

5. The induction coil assembly of claim 1, wherein the first winding of the first induction coil and the second winding of the second induction coil each have a uniform radius decrease, and wherein the second winding of the first induction coil and the second winding of the second induction coil each have a uniform radius increase.

6. The induction coil assembly of claim 1, wherein the first terminal end and second terminal end of the first induction coil and the first terminal end and second terminal end of the second induction coil are spaced at different azimuthal locations.

7. The induction coil assembly of claim 1, wherein the first and second terminal ends of the first induction coil and the first and second terminal ends of the second induction coil are spaced generally opposite from each other in an x-direction, the x-direction being generally perpendicular to the z-direction.

8. The induction coil assembly of claim 1, wherein the first terminal end of the first induction coil is disposed below the second terminal end of the first induction coil in the z-direction.

9. The induction coil assembly of claim 1, wherein the first terminal end of the second induction coil is disposed below the second terminal end of the second induction coil in the z-direction.

10. The induction coil assembly of claim 1, wherein the first terminal end of the first induction coil and the first terminal end of the second induction coil are configured to be coupled to an RF power source.

11. The induction coil assembly of claim 1, wherein the second terminal end of the first induction coil and the second terminal end of the second induction coil are configured to be coupled to ground via a capacitor.

12. A plasma processing apparatus, comprising:

a processing chamber;

a showerhead configured to feed one or more process gases into the processing chamber;

a workpiece support disposed within the processing chamber, the workpiece support configured to support a workpiece;

a plasma source configured to generate a plasma from the one or more process gases in the processing chamber, the plasma source comprising:

a first induction coil having a first winding and a second winding, the first winding commencing from a first terminal end in a first position in a z-direction and transitioning to a radially inner position in a plane normal to the z-direction, the second winding commencing from the radially inner position and transitioning to a radially outer position in a second plane normal to the z-direction and terminating in a second terminal end; and a second induction coil having a first winding and a second winding, the first winding commencing from a first terminal end in a first position in the z-direction and transitioning to a radially inner position in a plane normal to the z-direction, the second winding commencing from the radially inner position and transitioning to a radially outer position in a second plane normal to the z-direction and terminating in a second terminal end;

wherein the first induction coil and second induction coil are disposed in a stacked arrangement.

13. The plasma processing apparatus of claim 12, wherein the first terminal end of the first induction coil is disposed below the second terminal end of the first induction coil in the z-direction, and wherein the first terminal end of the second induction coil is disposed beneath the second terminal end of the second induction coil in the z-direction.

* * * * *